United States Patent [19]

Cabot

[11] Patent Number: 4,560,950

[45] Date of Patent: Dec. 24, 1985

[54] METHOD AND CIRCUIT FOR PHASE LOCK LOOP INITIALIZATION

[75] Inventor: Richard C. Cabot, Beaverton, Oreg.

[73] Assignee: Tektronix, Inc., Beaverton, Oreg.

[21] Appl. No.: 537,467

[22] Filed: Sep. 29, 1983

[51] Int. Cl.$^4$ ............................................. H03L 7/00
[52] U.S. Cl. ................................... 331/1 A; 331/16; 331/25; 328/134; 328/155; 307/527
[58] Field of Search .................... 331/1 A, 11, 16, 18, 331/25; 328/72, 73, 134, 155; 307/269, 527

[56] References Cited

U.S. PATENT DOCUMENTS 4,309,662 1/1982 Baudoux ........................ 331/1 A X Primary Examiner—Eugene R. LaRoche
Assistant Examiner—Robert J. Pascal
Attorney, Agent, or Firm—William A. Birdwell; George T. Noe

[57] ABSTRACT

A method and circuit for quickly adjusting the frequency of a phase lock loop controlled oscillator to match a reference frequency signal by starting the reference frequency signal at essentially zero initial phase coincident with a zero crossing of the oscillator output. The reference frequency signal is provided by dividing a higher source frequency signal a predetermined amount. Upon receipt of an initialization signal the divider and the phase lock loop are inhibited. Upon the occurrance of a zero crossing the divider and loop are enabled so that the reference signal starts at zero phase within a predetermined period following the zero crossing, and the loop thereafter adjusts the oscillator frequency.

12 Claims, 3 Drawing Figures

METHOD AND CIRCUIT FOR PHASE LOCK LOOP INITIALIZATION

BACKGROUND OF THE INVENTION

This invention relates to circuits for the control of the frequency of a sine wave oscillator, particularly circuits employing a phase lock loop to achieve such control.

In a variable frequency sine wave signal source it is desirable to produce a sine wave output signal with minimal distortion, to accurately establish and maintain the frequency of the signal, and to achieve frequency stability after adjustment of the frequency as rapidly as possible. Oscillators of various topographies, particularly state variable, resistor-capacitor oscillators, can be made to produce a high quality, that is, low distortion, sine wave output; however, the frequency of such an oscillator is not especially stable, it being affected by variations in component characteristics due to temperature changes. One way to accurately establish and maintain the frequency of such an oscillator is to provide a phase lock loop control circuit which adjusts the frequency of the oscillator relative to the frequency of a reference signal whose waveform is rectangular, rather than sinusoidal, but whose frequency is highly stable. Oscillator frequency control circuits of this type are commonly known, the oscillator frequency being voltage controlled in response to the integral of the phase difference between the oscillator output signal and reference frequency signal.

A problem encountered with phase lock loop controlled oscillators is that at low frequencies, for example, 10 hertz, the time required for the phase lock loop to lock the oscillator signal in phase with the reference signal may be substantial. The time required to achieve lock increases as the tuning range of the oscillator control circuit decreases, yet a limited tuning range is desirable because the frequency modulation noise introduced in the oscillator output due to noise in the phase lock loop increases as the tuning range of the control circuit increases. Hence, there is a need for a method of oscillator frequency control and implementation circuitry that will quickly achieve a phase lock between the oscillator output signal and a reference frequency signal.

SUMMARY OF THE INVENTION

The present invention solves the aforementioned problem by providing a method and circuit for initializing the phase of the reference frequency signal to match, within a predetermined tolerance, the phase of the oscillator signal being locked at the time that the reference signal starts. This is accomplished by detecting a zero crossing of the oscillator signal and starting the reference signal with an initial phase of essentially zero coincident with the zero crossing of the oscillator signal.

A phase lock loop circuit for controlling the frequency of an oscillator employs a phase difference detector responsive to a rectangular wave representation of the oscillator output signal and to a square wave reference frequency signal, which produces a rectangular wave error signal representative of the phase difference. The error signal is transmitted through a loop filter to produce a control signal for adjusting the frequency of the oscillator, the loop filter converting the rectangular wave output of the phase detector to a DC signal, i.e., the integral of the phase difference signal. The invention provides a zero crossing detector responsive to the square wave representation of the oscillator signal, a circuit for inhibiting the control signal, and a circuit for starting the reference frequency at zero initial phase within a predetermined time period following the zero crossing of the oscillator signal.

There are at least three circumstances in which it is necessary to match the phase of the reference signal to that of the oscillator:

(1) when a new oscillator frequency is selected (the usual case);

(2) when there is a disturbance in the reference signal; and (3) upon the occurrence of a start-up or restart condition.

When such a circumstance arises, the control signal and the reference signal are inhibited until a zero crossing of the oscillator signal is detected. Upon detection of the zero crossing, the control signal is reestablished, and the reference signal is started at essentially zero phase, within a predetermined tolerance, coincident with the zero crossing. It is then only necessary for the phase lock loop to adjust the oscillator frequency to match the reference frequency.

The reference frequency signal is a square wave signal provided and controlled by digital circuitry. The signal source for the reference frequency is a highly stable periodic pulse generator producing pulses at a fixed frequency much higher than the reference frequency. The reference frequency is obtained by dividing the source frequency down, the reference frequency being adjustably established by the amount of the division.

The source frequency signal is always available. While the reference frequency is started by allowing the dividing circuit to start counting, so that the reference frequency does not start with precisely zero phase relative to the zero crossing of the oscillator signal, the phase error is, as a practical matter, insignificant due to the relatively higher frequency source signal.

It is therefore a principal objective of the present invention to provide a novel method and circuit for quickly stabilizing the frequency of low distortion, sinusoidal oscillator.

It is another principal objective of the present invention to provide a method and circuit which accomplishes the stabilization and control of oscillator frequency by employing a phase lock loop in which the reference frequency is initialized by starting it at zero phase within a predetermined time period following a zero crossing of the oscillator frequency.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
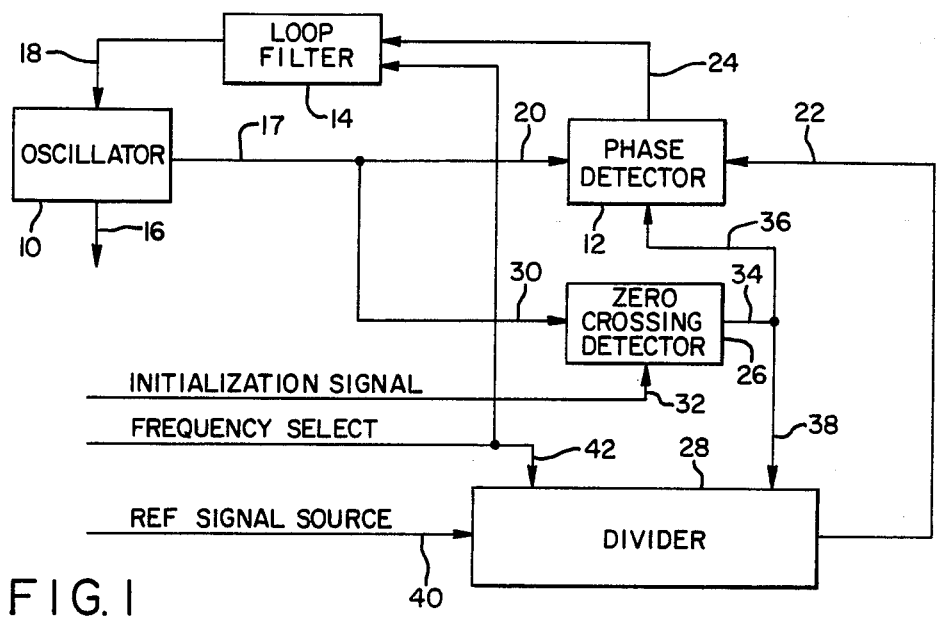
FIG. 1 is a block diagram illustrating an oscillator control circuit according to the principles of the present invention.

Referring first to FIG. 1, a sine wave oscillator 10 is frequency controlled by a phase lock loop, comprising a phase detector 12 and a loop filter 14. The oscillator may employ any of a variety of commonly known voltage controlled oscillator topologies which will produce, at an output 16, a sine wave signal with minimal distortion and whose frequency may be controlled by a variable voltage input 18. One such topology is the commonly known state variable, resistor-capacitor oscillator. The oscillator 10 also includes circuitry of a type commonly known in the art for producing a rectangular wave output 17 corresponding in frequency and phase to the sinusoidal output 16.

The phase detector 12 compares the phase of the oscillator rectangular wave output signal 17 at a first input 20 with a square wave reference signal at a second input 22, thereby producing a rectangular waveform error signal at its output 24. The loop filter 14 converts the rectangular waveform error signal to a direct current control signal for application to the oscillator at input 18. While a typical oscillator 10 of the type described provides by itself less than satisfactory frequency stability for many applications, it does provide a low distortion sinusoidal signal. At the same time, while the reference frequency signal has a square waveform, such a signal can be generated with excellent frequency stability by commonly known digital techniques.

The initialization circuit of the present invention adds to the phase lock loop a zero crossing detector 26, means for inhibiting the production of an error signal at output 24 and, hence, for inhibiting the production of a control signal, and a divider circuit 28 for producing, from a fixed frequency pulse signal source, a reference signal having a selected frequency. The zero crossing detector 26 accepts at an input 30 the oscillator rectangular wave signal 17 and at an input 32 an initialization signal. Upon receipt of an initialization signal it provides an inhibit signal at output 34 which is received by the phase detector 12 at input 36 and by the divider 28 at input 38. The inhibit signal causes the phase detector to inhibit the generation of a phase error signal and causes the divider 28 to stop dividing the reference source signal input 40 into the reference frequency signal and to reset.

After an initialization signal has occurred the zero crossing detector 26 awaits the first positive going zero crossing of the oscillator signal. Upon the occurrence of that zero crossing the detector 26 allows the divider 28 to start counting again and the phase detector 12 to produce a phase error signal. The divider 28 will start counting with a zero initial phase, the first pulse occurring within a very short predetermined period after it has been allowed to count. This is because regardless of the amount by which the reference signal source is divided the reference signal source frequency is chosen high enough that the delay between the termination of the inhibit signal and the first pulse counted by the divider is within a tolerable time following the oscillator signal zero crossing. The actual reference frequency is determined by the frequency of the reference signal source and a frequency select signal provided at input 42 to the divider.

Figure 2:
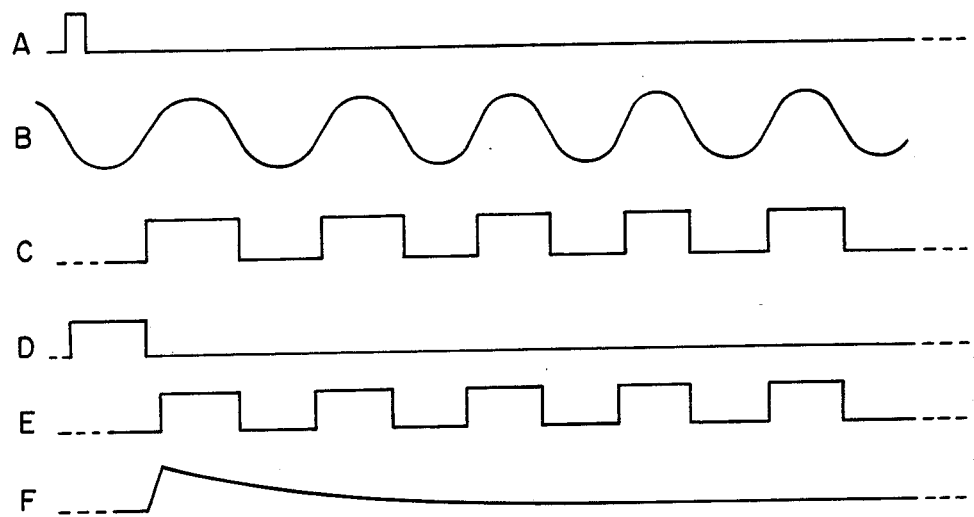
FIGS. 2A—E are illustrations of exemplary waveforms at various locations in the block diagram of FIG. 1.

Turning to FIGS. 2A-E, a waveform representative of the initialization signal is shown first in FIG. 2A. The oscillator output signal 16 is shown in FIG. 2B, and its corresponding rectangular waveform is shown in FIG. 2C. FIG. 2D shows the inhibit signal which is generated upon the occurrence of an initialization signal and is extinguished as soon as the first positive going zero crossing occurs after the initialization signal. FIG. 2E shows the reference frequency signal which starts within a very short, tolerable period following the zero crossing and continues until the next initialization signal. FIG. 2F shows the control signal input 18 to the oscillator resulting from the phase detector 12 and loop filter (integrator) 14, as the oscillator adjusts its frequency to eliminate phase difference between the reference signal and the oscillator signal.

Figure 3:
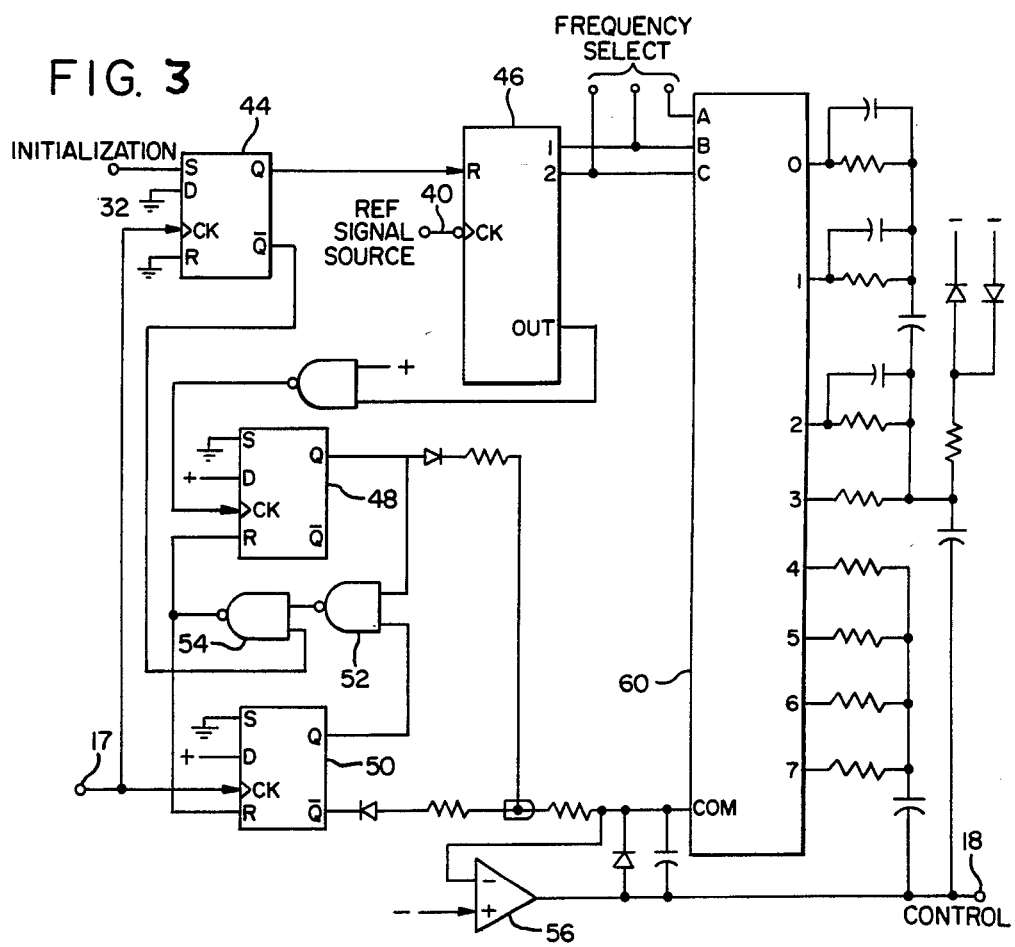
FIG. 3 is a simplified schematic diagram of a preferred embodiment of a circuit employing the principles of the present invention.

In the schematic diagram of the preferred embodiment of the invention, shown in FIG. 3, the zero crossing detector comprises a D flip-flop 44 having as its SET input the initialization signal 32 and as its CLOCK input the oscillator rectangular wave output 17. A programmable decade divider 46 has as its reset input the Q output of the flip-flop 44 and as its CLOCK input the reference signal source 40. The phase detector comprises D flip-flops 48 and 50, the former having as its CLOCK input the inverted output from the divider and the latter having as its CLOCK input the oscillator rectangular wave output 17.

Upon receipt of an initialization signal the flip-flop 44 is set, which produces an inhibit signal causing the divider 46 to reset. This also causes the phase detector to reset, as explained below. This inhibits the production of a control signal and prepares the divider to start the reference signal at zero initial phase. At the next positive going transition of the oscillator rectangular wave signal the flip-flop 44 will clock, thereby extinguishing the inhibit signal. (It is recognized that the circuit could be modified to detect the first negative going zero crossing, or the first zero crossing of either direction, without departing from the principles of the invention.)

When the CLOCK input of either flip-flop 48 or 50 experiences a rising edge a high signal is clocked into the respective flip-flop Q outputs. When both Q outputs are high the output of negative output AND gate 52 goes low, causing the output of negative output AND gate 54 to go high and thereby resetting both flip-flops. If the reference signal produces a rising edge first, the Q output of flip-flop 48 and the $\bar{Q}$ output of flip-flop 50 will both become high, causing a high output from the phase detector. If the oscillator signal produces a rising edge first, the Q output of flip-flop 50 and the $\bar{Q}$ output of flip-flop 48 both become low, causing a low output from the phase detector. If the two rising edges are in phase the output of the phase detector will not go high or low, but will remain in its current state unaffected.

The phase difference signal produced by the phase detector is filtered by operational amplifier 56 in conjunction with a resistor-capacitor combination selected by a programmable switch 60, such as an 8-channel analog multiplexer, whose selection is determined by a binary frequency select input 42. This produces a control signal representative of the integral of the phase difference signal, that is representative of the original frequency difference between the oscillator and reference signals. The frequency select input also serves to select the amount by which the divider divides the reference signal source, for example, by 10, 100, 1,000, or 10,000, in order to produce the reference frequency.

The $\bar{Q}$ output of the flip-flop 44 drives a negative output AND gate 54 in the phase detector. When the $\bar{Q}$ signal goes low as a consequence of the receipt of an initialization signal, the output of that AND gate goes high and thereby resets flip-flops 48 and 50. This inhibits operation of the phase detector and, hence, the generation of a control signal.

It is recognized that while the foregoing specific embodiment is the preferred embodiment, other embodiments could work without departing from the principles of the present invention, and that its application is not limited to the control of the frequency of oscillators of any particular topology.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

I claim:

1. A method for adjusting the frequency of an oscillator relative to the frequency of a reference signal, said method comprising the steps of:
   (a) detecting a zero crossing of an output signal from said oscillator;
   (b) starting said reference frequency signal at zero initial phase within a predetermined time period following said zero crossing;
   (c) comparing the phase of said oscillator output signal to the phase of said reference signal and producing from such comparison an error signal representative of the phase difference between said oscillator output signal and said reference signal; and
   (d) adjusting the oscillator frequency based on said error signal, thereby to minimize any phase difference between said oscillator output signal and said reference signal.

2. The method of claim 1, further comprising allowing said oscillator to operate without adjusting its frequency relative to a reference frequency signal until said zero crossing of said oscillator output signal occurs.

3. The method of claim 1 further comprising deriving said reference signal from pulses at a frequency higher than said reference signal by dividing said higher frequency down to said reference frequency, said division being started coincident with said zero crossing.

4. A phase lock loop circuit for adjusting the frequency of an oscillator relative to the frequency of a reference signal, the oscillator having an output and a frequency control input, said circuit comprising:
   (a) adjustment means comprising phase detector means for producing an error signal representative of the phase difference between said oscillator output and said reference signal, and loop filter means for producing from said error signal a frequency control signal for said oscillator; and
   (b) initialization means, responsive to said oscillator output and to an initialization signal, for starting said reference signal at zero initial phase within a predetermined time period following a zero crossing of said oscillator output.

5. The circuit of claim 4 wherein said initialization means comprises zero crossing detector means for detecting said zero crossing of said oscillator output and reference means responsive to said zero crossing detector means for producing said reference signal starting at zero initial phase within a predetermined time period following said zero crossing.

6. The circuit of claim 5 wherein said zero crossing detector means includes means for producing an inhibit signal in response to an initialization signal, said reference means includes means responsive to said inhibit signal for inhibiting the production of said reference signal until a zero crossing is detected, and said adjustment means includes means responsive to said inhibit signal for inhibiting the production of said control signal until a zero crossing is detected.

7. The circuit of claim 5 wherein said reference frequency is derived from a pulse source signal having a frequency greater than said reference frequency, and said reference means comprises divider means for dividing said source signal to provide pulses at said reference frequency in response to a start signal from said zero crossing detector means.

8. The circuit of claim 7 wherein said divider means includes a frequency data input for accepting a signal representative of the amount by which the pulse source signal should be divided, said divider means dividing said source signal in accordance therewith.

9. The circuit of claim 4 wherein said initialization means includes means for producing an inhibit signal and said phase detector means includes means, responsive to said inhibit signal, for inhibiting said phase detector from producing an error signal.

10. The circuit of claim 4 wherein said oscillator output includes a rectangular waveform signal and said phase detector means includes means, responsive to said oscillator rectangular waveform signal and said reference frequency, for comparing the phase of said oscillator output with said reference frequency pulses and producing as said error signal pulses having a width proportional to the phase difference thereof, and filter means for converting said variable width pulses to a control signal whose amplitude represents the original frequency difference between said oscillator and reference signals.

11. A circuit for controlling the frequency of an output signal of a voltage controlled oscillator, comprising:
   a source of periodic reference signal;
   means for generating an error signal voltage indication of a phase difference between a reference signal and said output signal, said error signal voltage being integrated and applied to said oscillator to control the frequency of said output signal;
   means for detecting a zero phase of said output signal; and
   means responsive to an applied initialization signal for inhibiting said reference signal until said means to detect detects said zero phase of said output signal.

12. A circuit as in claim 11 further comprising:
   means responsive to said initialization signal for inhibiting said error signal such that said output signal frequency remains unchanged until said means to detect detects said zero phase of said output signal.

* * * * *